United States Patent [19]

Fabian

[11] Patent Number: 4,525,919
[45] Date of Patent: Jul. 2, 1985

[54] FORMING SUB-MICRON ELECTRODES BY OBLIQUE DEPOSITION

[75] Inventor: Walter Fabian, Burlington, Mass.

[73] Assignee: Raytheon Company, Lexington, Mass.

[21] Appl. No.: 388,841

[22] Filed: Jun. 16, 1982

[51] Int. Cl.³ .......................................... H01L 21/285
[52] U.S. Cl. ......................................... 29/571; 29/579; 29/591; 148/DIG. 143; 427/91
[58] Field of Search ................. 29/571, 579, 591, 578; 427/91; 148/DIG. 143

[56] References Cited

U.S. PATENT DOCUMENTS

| 3,846,822 | 11/1974 | Riley et al. | 357/23 |
| 3,851,379 | 12/1974 | Gutknecht et al. | 29/579 X |
| 3,908,262 | 9/1975 | Stein | 29/579 |
| 3,920,861 | 11/1975 | Dean | 427/88 |
| 3,951,708 | 4/1976 | Dean | 29/579 X |
| 4,145,459 | 3/1979 | Goel | 427/88 |
| 4,194,285 | 3/1980 | Goel | 29/579 |
| 4,337,115 | 4/1980 | Ikeda et al. | 29/591 X |
| 4,377,899 | 3/1983 | Otani et al. | 29/579 X |

FOREIGN PATENT DOCUMENTS 8972 1/1979 Japan .................................... 29/579

OTHER PUBLICATIONS

"Portable Conformable Mask-A Hybrid Near-Ultraviolet and Deep Ultraviolet Patterning Technique," SPIE, vol. 174, pp. 114-121, by B. J. Lin.

Primary Examiner—Brian E. Hearn
Assistant Examiner—Alan E. Schiavelli
Attorney, Agent, or Firm—Denis G. Maloney; Richard M. Sharkansky; Joseph D. Pannone

[57] ABSTRACT

A method for forming a field effect transistor having a submicron gate length. A gate electrode is formed by angularly depositing metal through an aperture formed in a thick masking layer. A substrate upon which the gate electrode is to be formed is placed in an apparatus for depositing a stream of evaporated metal through the aperture onto portions of the substrate surface exposed by the aperture. The stream is directed at a selective oblique angle $\theta$ with respect to a normal to the surface of such substrate. Portions of the exposed surface of the substrate are shadowed from the obliquely directed stream of evaporated metal by an edge of the aperture formed in the thick masking layer. Thus, only selected portions of such obliquely directed stream of evaporated metal are deposited onto unshadowed portions of the substrate to thereby provide the gate electrode. The width w' of the portion of the gate electrode in contact with the substrate, and hence the gate length of the field effect transistor, is related to the angle $\theta$, the aperture width w, and aperture height h by $w' = w - (h)(\tan \theta)$. Such parameters are selected to provide a gate length which is less than a micron even though the aperture width is greater than or equal to a micron and hence one which can be formed using conventional optical photolithographic techniques. Edges of the masking layer are formed to overhang portions of the sidewall of the aperture to thereby shield such portions of the sidewall, thus providing separation between the evaporated metal deposited through the aperture onto the substrate and the evaporated metal deposited on the masking layer.

7 Claims, 19 Drawing Figures

FORMING SUB-MICRON ELECTRODES BY OBLIQUE DEPOSITION

BACKGROUND OF THE INVENTION

This invention relates generally to methods for manufacturing a conductor and more particularly to methods for manufacturing a conductor for use with semiconductor devices.

As is known in the art, a conductor is often formed on a substrate to provide, for example, a gate electrode for a field effect transistor (FET). The width of the gate electrode partially determines the gate length, and hence the charge transport characteristics, of the FET. In operation, when an FET turns on, a charge packet builds up under the gate electrode. In order to turn the FET off, the charge packet must be removed from under the gate electrode. By passing across a wide gate electrode the transit time of the charge packet, which is proportional to the width of such electrode, will be relatively long. Thus, by reducing the width of the gate electrode, the transit time of the charge packet across the gate electrode will decrease. This decrease in the transit time of the charge permits shorter time durations to remove the charge packet and hence permits an increase in the maximum operating frequency for the FET device. As is known in the art, a method to reduce the width of the gate electrode to submicron widths is the so-called electron beam lithography technique. This technique uses a beam of electrons, for example, to transfer a preprogrammed pattern directly to the wafer surface (direct write technique) or to form a master mask blank. With the direct write method, for each submicron step, each wafer must be individually placed in the electron beam apparatus; a very time consuming and expensive process, particularly for a production orientated line. Thus, while gate electrode width reduction is achieved using this technique, the expense of such equipment and lack of an acceptable production technique makes the direct write electron beam lithography technique impractical for certain applications. Mask generation using electron beam lithography is likewise high in cost.

A second technique involves the use of X-ray exposure systems. Currently collimated high intensity exposure sources are being developed. Currently this technique due to the lack of acceptable collimated sources, is not easily adaptable for production applications. For those applications, where the use of the above submicron lithography techniques are not cost effective, other methods of forming submicron conductors have been devised. A prior art method of forming a submicron conductor using micron photolithography includes the steps of: photolithographically forming an aperture in a masking layer to expose a portion of the substrate; over-plating a surface of such masking layer while protecting the exposed portion of the substrate to provide such aperture with a reduced, sized opening; and depositing a layer of metal through such reduced sized opening on to the exposed portion of the substrate, with the over-plating acting as a mask to restrict the width of such deposited metal substantially to the width of the sized opening. This method has several disadvantages including difficulty in controlling the plating process to provide an accurately sized opening to form accurately sized conductors, and further, the uniformity of resolution obtained by such a technique is often unacceptable in some applications.

SUMMARY OF THE INVENTION

In accordance with the present invention a field effect transistor having a submicron gate length is provided. A high resolution aperture is formed in a selective portion of a thick masking layer provided on the substrate using optical photolithographic techniques. The masking layer has a predetermined opening width (w), and the aperture has a depth (h), and length (L). With portions of the exposed substrate shadowed by the aperture, a stream of evaporated metal is then angularly deposited through the aperture onto the substrate. The stream is deposited at an oblique angle $\theta$ with respect to a normal to the surface of the substrate. The evaporated metal deposited on the exposed surface of the substrate provides a gate electrode. The gate electrode thus provides the gate having a length w' on such surface which may be represented as $w' = w - (h) \tan \theta$. With such an arrangement, a gate electrode providing a submicron gate is formed on a substrate using micron optical photolithographic techniques. Further, by evaporating a stream of metal at an oblique angle with respect to a normal to the surface of the substrate excess metal not deposited on the surface of the substrate builds up on the gate electrode increasing the thickness thereof. The gate electrode thickness provides a gate electrode having a relatively low resistance, thus reducing the signal loss of a signal feed through such gate electrode.

In accordance with an additional aspect of the present invention, a pair of orthogonal gate electrodes of a pair of orthogonal field effect transistors are formed on a substrate. Each one of the gate electrodes provides a corresponding gate. Each gate electrode is formed in a corresponding aperture formed in a masking layer provided on the substrate, each aperture having a predetermined height (h), width (w) and length (L). In order to form a pair of gate electrodes perpendicular to each other, the corresponding apertures formed in the masking layer are formed perpendicular to each other. A stream of metal is deposited on the substrate at the incident angle $\theta$ and at an angle $\phi$, where $\phi$ is the angle between the orthogonal projection of the direction of the beam onto the plane of the surface of the substrate and the shadowing edge of one of such apertures. The width $w'_i$ of the $i^{th}$ gate electrode formed on the substrate is related to the angle $\theta$, aperture width w, aperture height h, aperture length L, and the angle $\phi$ by $w_i = w(h) \tan \theta \sin \phi$. With such an arrangement, by selecting $\phi$ to be 90° C. with respect to the length of the first aperture and 0° with respect to the length of the second aperture, the gate electrode formed in the first aperture will have a width which may be represented as $w' = w - (h) \tan \theta$, whereas the gate electrode formed in the second aperture will have a width given as $w' = w$. Thus, in the same processing step a first set of gate electrodes is provided with a reduced line width whereas a second set of gate electrodes are not reduced in width. Thus, by varying between 0° and 90°, an extra degree of control on the width of the gate electrodes is provided.

In a preferred embodiment of the invention, edges of the masking layer overhang portions of a sidewall of the aperture to provide a separation between the gate electrode formed in the aperture and the evaporated metal deposited on the masking layer. With such an arrangement, the separation thus provided insures proper liftoff of the masking layer without damage to the gate electrode.

BRIEF DESCRIPTION OF THE DRAWINGS

For a better understanding of this invention, reference is made in the following more detailed description to the drawings wherein.

DESCRIPTION OF THE PREFERRED EMBODIMENT

Figure 1:
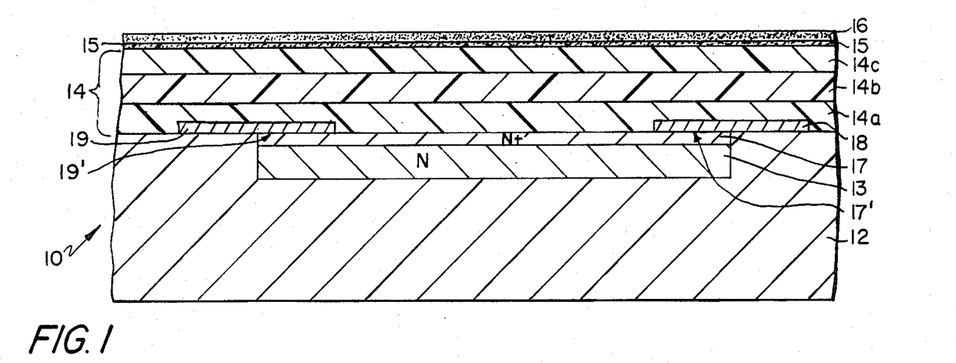
FIGS. 1-5 are cross-sectional, diagrammatical views showing steps in the construction of a field effect transistor (FET) having a gate electrode with a submicron width formed on the substrate.

Fabrication of a field effect transistor (FET) with a gate electrode having a submicron width, formed on a surface of a substrate using micron width photolithographic techniques, will be initially described in conjunction with the cross-sectional views of FIGS. 1-5. Referring first to FIG. 1, a wafer 10 is shown to include a substrate 12, here low conductivity type gallium arsenide (GaAs), having an isolated N-type doped GaAs region 13 provided in the substrate 12, and an isolated N+ type doped GaAs region 17 provided into the N-type region 13, as shown. The N-type region 13 and N+ type region 17 are formed in a conventional manner using techniques such as ion implanting dopant particles. Other conventional techniques for forming regions 13, 17 may alternatively be used. A drain contact region 17' and a source contact region 19' are provided by the N+ layer 17, as shown. A drain electrode 18 and a source electrode 19 are provided on the drain contact region 17' and source contact region 19' forming ohmic contact therewith. (Alternatively, the N+ region 17 may be eliminated, and source 19 and drain 18 may be alloyed with the N− type region 13 to provide the ohmic contacts therewith.) A first masking layer 14, here a composite masking layer made up of layers 14a, 14b, 14c, is deposited on the substrate 12, electrodes 18, 20, and exposed portions of layer 17 and a second masking layer 16 is deposited on the first masking layer 14, as shown. An interfacial layer 15 is formed as a result of intermixing of masking layers 14, 16. Masking layer 14 here includes a plurality of layers 14a–14c, of a positive type photoresist here polymethyl methocrylate (PMMA) photoresist which is responsive to high energy (deep) ultraviolet (uv) radiation. Such high energy radiation is here characterized by having a wavelength in the range of 2000 Angstroms (A) to 3300 A. Each one of such layers 14a–14c of photoresist is sequentially applied and cured in a conventional manner. The photoresist layers 14a–14c are applied such that the combination of such layers 14a–14c provides the masking layer 14 having a thickness, here in the range of 0.5 microns to 3.0 microns. The preferable thickness for masking layer 14 is here 2.5 microns. Masking layer 14 is here relatively thick, to provide a sufficient smoothing effect of the surface of the substrate 12. The upper limit of the thickness of masking layer 14 is determined by the exposure time properties of the photoresist. Masking layer 16 is here a layer of high resolution positive type photoresist, such as AZ 1350J photoresist manufactured by Shipley Company, Inc., 2300 Washington St., Newton, MA 02162, which is responsive to low energy (near) uv radiation and opaque to high energy (deep) uv radiation. Such low energy radiation is here characterized by having a wavelength in the range of 3300 A to 4000 A. Masking layer 16 has a thickness generally in the range of 0.2 microns to 0.5 microns. The preferred thickness for masking layer 16 is here 0.3 microns. The preferred thickness for masking layer 16 is determined by the following considerations: A very thin masking layer 16 may provide insufficient opacity to high energy radiation; thus, when the masking layer 16 is exposed to a blanket exposure of such high energy radiation, the entire surface of the masking layer 14 beneath will be activated and, hence, the pattern in masking layer 16 would not be selectively transferred to masking layer 14. However, a very thick masking layer 16 may provide low resolution and non-uniform patterns in masking layer 16 which, when ultimately transferred to masking layer 14, will provide similar low resolution and non-uniform patterns on the substrate 12. In any event, the thickness of the second masking layer 16 is less than the thickness of the first masking layer 14. A preferrable thickness ratio ($t_1:t_2$) here is approximately 8:1 where $t_1$ is the thickness of masking layer 14 and $t_2$ is the thickness of masking layer 16. Thus, the masking layer 14 is provided on the substrate 12 to effectively increase the degree of surface flatness, while the thin masking layer 16 is provided on the masking layer 14 to permit formation of a high resolution pattern in masking layer 14 in a manner now to be described.

Figure 2:
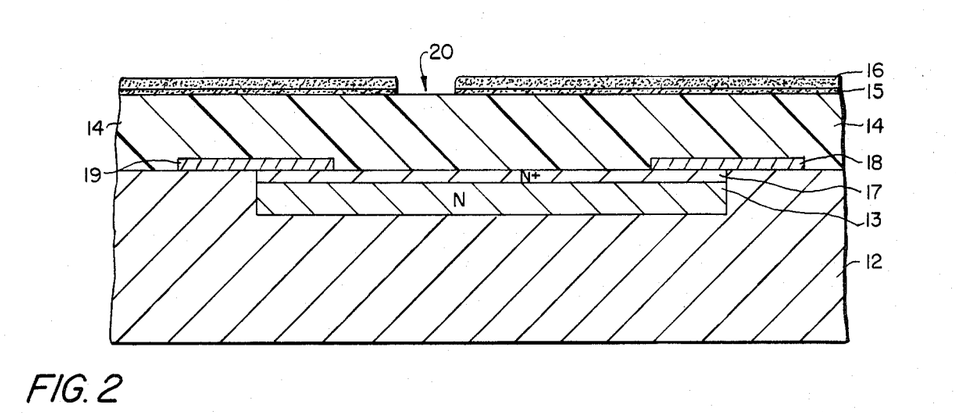

Referring now to FIG. 2, a high resolution aperture 20, here one micron wide, is formed between drain electrode 18 and source electrode 19 in a selected portion of the masking layer 16 using either a near uv contact mask alignment system (not shown) or a near uv projection mask alignment system (not shown). (The critical alignment of a gate electrode 32 (FIGS. 4, 5) between drain electrode 18 and source electrode 19 is explained in conjunction with FIG. 4.) Aperture 20 is here a T-shaped aperture, as shown in FIG. 6 to provide a location for a gate pad as will be described in connection with FIG. 8. Masking layer 16 which was formed on masking layer 14 has a high degree of surface flatness since the masking layer 14 in combination with masking layer 16 acts to smooth out the surface irregularities of the substrate 12. As is known in the art in general, the degree of resolution and uniformity of resolution obtained in a masking layer is inversely related to both the thickness of such masking layer and the surface flatness of such masking layer. Thus, the thin masking layer 16, which is made sufficiently thick to be opaque to deep uv radiation, permits formation of the high resolution aperture 20. The aperture 20 is formed as follows: masking layer 16 is provided with a suitable mask (not shown) such as a contact type mask or projection type mask and a selective portion of the masking layer 16 is exposed through the mask by the near uv radiation source which transfers the pattern in the mask to the masking layer 16. The exposed portion of masking layer 16 is developed (using A2 type developer by Shipley) and etched away to provide the high resolution aperture 20 in masking layer 16, as shown. Generally, the aperture has a width (w) equal to 1.0 micron and a predetermined length (L). The aperture 20 formed in the masking layer 16 exposes a selective portion of the interfacial layer 15. This exposed portion of the interfacial layer 15 is removed by using a $O_2$ plasma etch, leaving the aperture 20 in the masking layer 16 and exposing an underlying portion of the thicker masking layer 14, as shown.

Figure 3:
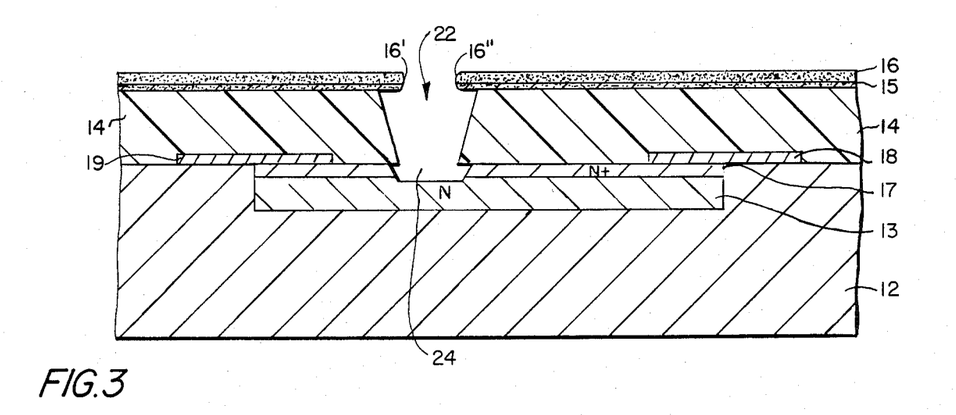

Referring now to FIGS. 3 and 6, the masking layer 16 is used as a contact mask and the pattern in masking layer 16 is transferred to masking layer 14 by exposure to a deep uv blanket radiation source (not shown). As previously described, masking layer 16 is selected to be opaque to deep uv radiation. Thus, only the portion of the masking layer 14 selectively exposed by the aperture 20 formed in the mask layer 16 is substantially activated by the blanket exposure to the deep uv radiation. In this manner, the high resolution pattern provided by the aperture 20 in masking layer 16 is transferred to the masking layer 14. Thus, masking layer 16 serves as a contact mask for transferring a high resolution pattern provided therein to the thick masking layer 14. The portion of masking layer 14 exposed to the deep uv radiation is developed and etched away in a conventional manner to expose a selective portion of the N+ type region 17, thus providing a high resolution T-shaped aperture 22 (FIG. 6) through photoresist layers 14, 16, as shown. Aperture 22 here has overhanging portions 16', 16'' of masking layer 16 formed from selectively undercutting masking layer 14, as shown. The overhanging portions 16', 16'' are formed by the effects of deep uv radiation scattering in the aperture 20 (FIG. 2) and deep uv penetration of layer 16 in the areas adjacent the aperture 20 (FIG. 2). Said areas when exposed to the developer for the layer 14 (here chlorobenzene) will be developed and removed thus providing such overhanging portions 16', 16''. The above double layer masking technique used to achieve a high resolution pattern 22 on the substrate 12 is generally described in an article entitled "Portable conformable mask-a hybrid near-ultra violet and deep-ultra violet patterning technique", by B. J. Lin, Society of Photo-optical Instrumentation Engineers, Vol. 174, Developments in Semiconductor Microlithography IV (1979). The exposed portions of N+ layer 17 and substrate 12 are etched away to provide a T-shaped recess 24 (FIG. 6) which exposes a portion of the N-type layer 13 and etches a portion of the N-type layer 13. A portion of the recess 24 on the N-type layer 13 is here used to provide a contact area for the gate electrode to be formed in accordance with the invention. Here recess 24 thus provides a Schottky contact area to the N-type region 13 to provide a gate electrode between source electrode 19 and drain electrode 18.

Figure 4:
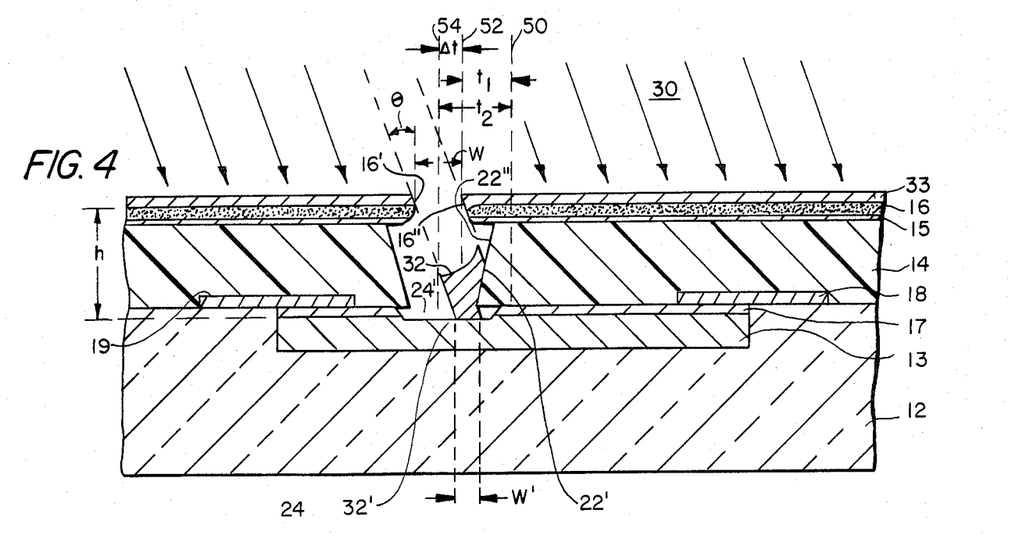
Figures 7, 8:
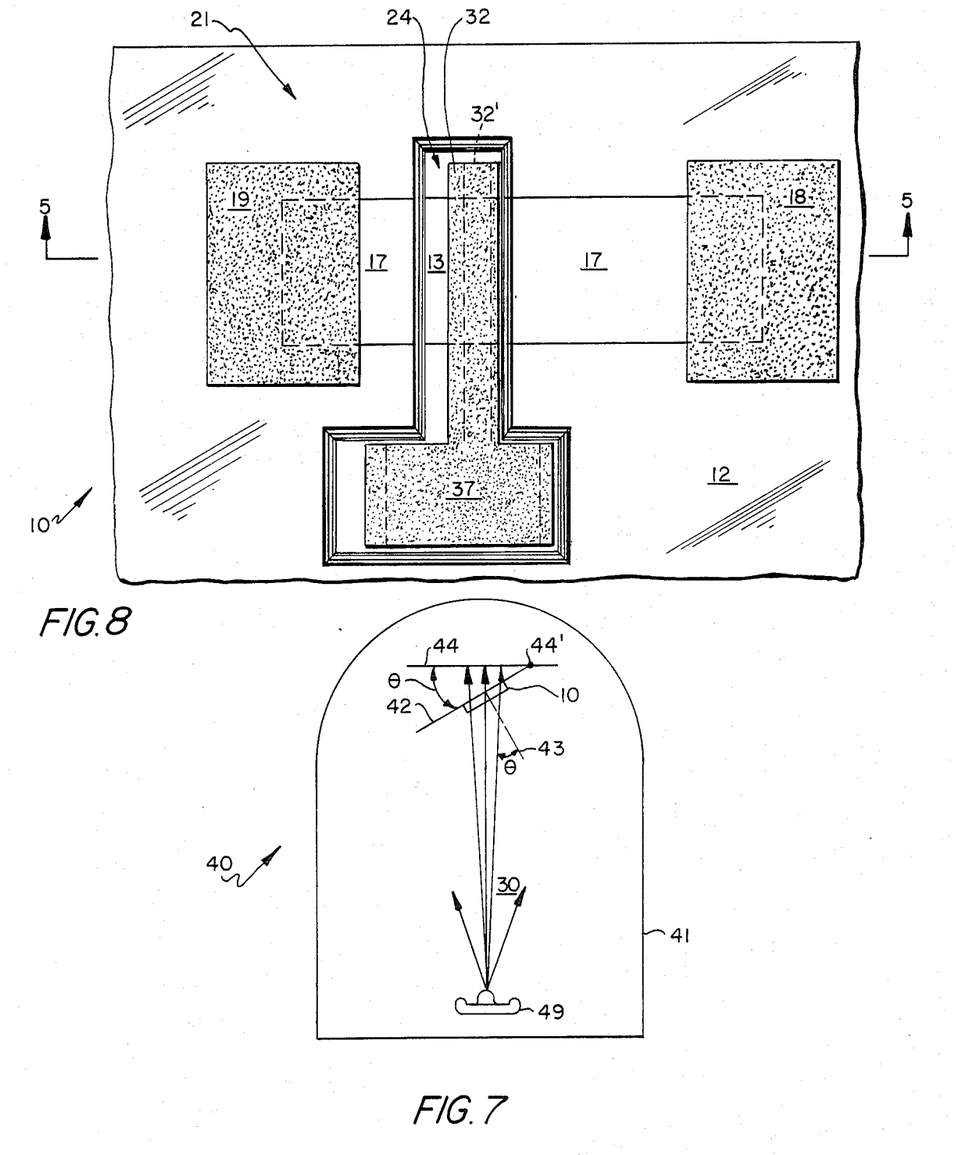
FIG. 7 shows a diagrammatical view of a metal evaporation apparatus for providing a stream of metal used to form the gate electrode of the FET of FIG. 6.
FIG. 8 is a top view of the FET of FIG. 5 having a gate electrode with a submicron width on the substrate of FIG. 4.
Figure 7A:
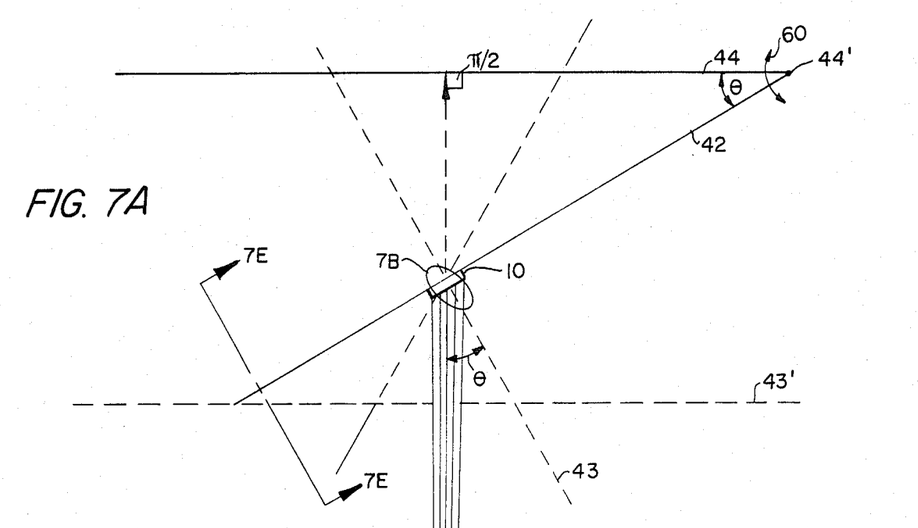
FIG. 7A is a diagrammatical drawing of the apparatus of FIG. 7, useful in defining critical geometric relationships thereof.
Figures 7B, 7C:
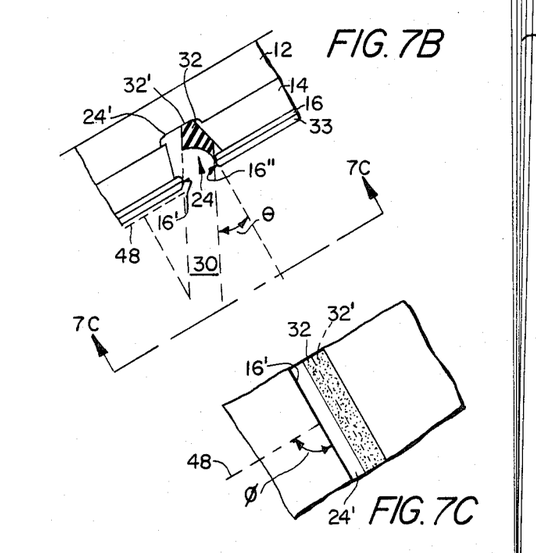
FIG. 7B is an enlarged view of the wafer on the wafer holder as shown in FIG. 7A.
FIG. 7C is a top view of the wafer on the wafer holder as shown in FIG. 7A.
Figures 7D, 7E:
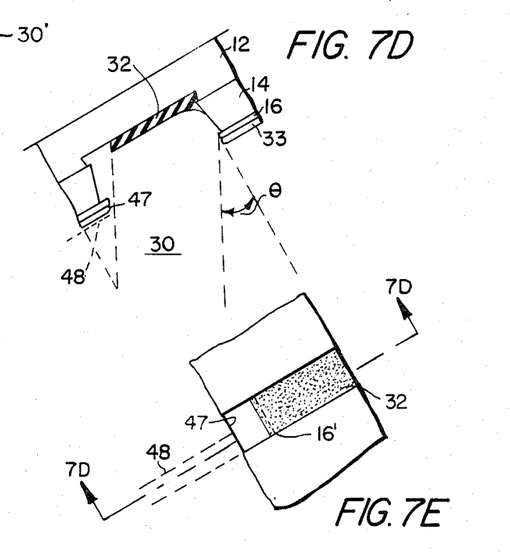
FIG. 7D is an enlarged view of the wafer on the wafer holder rotated about an axis by 90° as that shown in FIG. 7A.
FIG. 7E is a top view of the wafer shown in FIG. 7D.

Referring now to FIGS. 7, 7A–7E, the wafer 10 thus formed as shown in FIG. 3 is orientated in a conventional evaporation apparatus 40 for providing a stream 30 of evaporated conductor metal onto the substrate 12. A reservoir 49 is provided as the source of such conductor metal in a substantially evacuated evaporation chamber 41. The stream 30 of evaporated metal from the reservoir 49 is directed to the surface of the wafer 10 at an oblique angle $\theta$ with respect to an axis of rotation 43 (i.e., an axis normal to the surface of the wafer 10). In particular, referring to FIG. 7A, the wafer 10 is affixed to a wafer holder 42. The wafer holder 42 is pivotally attached to a fixed member 44, which is positioned substantially normal to a direction of the stream 30. The wafer holder 42 is rotatable about point 44' as indicated by the arrows 60 to position the surface of the substrate 10 at oblique angle $\theta$, as shown. Angular movement of the wafer holder 42 with respect to the fixed member 44 is generally provided between 0° and 90°. The holder 42 is positioned and fixed at a selective oblique angle $\theta$, as shown. As shown in FIGS. 7B, 7C, the wafer 10, is next positioned on the wafer holder 42 such that an orthogonal projection 48 of the direction of beam 30 in the plane of the surface of the wafer 10 is at an angle $\phi$, here 90° with respect to edge 16' (FIG. 7C) of the aperture 22. Here the edge 16' of the masking layer 16 shadows a portion 24' of the substrate 12 from the stream 30 as shown in FIG. 4. (In order to appreciate the importance of the angle $\phi$, as shown in FIGS. 7D, 7E, the wafer 10 if orientated (rotated about axis 43 by 90°) on wafer holder 42 such that the projection 48 on the wafer 10 is at an angle $\phi$ here equal to zero degrees with respect to the edge 16' of aperture 20 and normal to an edge 47 of the aperture 22, then the gate electrode formed therein has a width equal to the width of the aperture and no reduction in gate electrode width w (gate length) is provided.) Here the source holder 49 (FIG. 7) is spaced 16 inches from the wafer 10, the area of source holder 49 is 1 $cm^2$, and the surface area of wafer 10 is (2.5 in. $\times$ 2.5 in.). Thus, the source holder 49 (FIG. 7), in relation to the surface area of wafer 10 and distance therefrom approximates a point source 49' (FIG. 7A). The point source 49' provides a plurality of rays of the radial stream 30 of gate metal such as 30' substantially normal to the surface of the fixed member 44, in the area adjacent to the wafer 10, as shown in FIG. 7A. Since the stream is substantially normal to the fixed member 44 in an area adjacent the wafer 10, the oblique angle $\theta$ is substantially uniform across the entire wafer surface. Thus, the stream may be considered as having parallel rays directed to the wafer 10 at an incident angle $\theta$ with respect to the normal 43 to the surface of the wafer 10.

Referring now to FIG. 4, the stream 30 provided from the source 49 (FIG. 7A) is shown directed to the surface of the wafer 10 at the selected acute angle $\theta$ which is also equal to the angle between the direction of the stream and a normal to the surface of the substrate 10 since $\phi = 90°$ (FIG. 7C). Overhanging portion 16' of layer 16 in the aperture 22 mask or obstruct portions of the obliquely angled stream 30 from being deposited on the portion 24' of N-type layer 13. That is the overhanging portions 16' shadow portions 24' from the stream 30. Portions of the stream 30 are deposited on the N-type layer 13 and other portions are deposited on a sidewall portion 22' of masking layer 14 which increases the thickness of the gate electrode 32 and gate pad 37 as will be described. Remaining portions of the stream 30 are deposited on the top surface of layer 16 forming a metal layer 33. It is to be noted that to insure proper lift-off after formation of the gate electrode 32, the metal forming the gate electrode 32 and gate pad 37 must be mechanically discontinuous from the metal layer 33 deposited on the top of masking layer 16. This discontinuity is provided by overhanging edge 16'' shielding the upper portions 22''' of the sidewall aperture 22 from stream 30. The gate electrode portion of the aperture 22 has a width (w) related to the spacing of the overhanging portions 16', 16''. Such width w is determined by the pattern provided in the first masking layer 16 and here is 1 micron. The aperture 22 has a height (h) equal to the sum of the individual thickness of masking layer 14, masking layer 16, interfacial layer 15, and the depth of the recess 24. The width (w') of the conductor 32 formed in the recess 24 by the angled evaporation is represented as $w' = w - (h) \tan \theta \sin \phi$, where here $\phi = 90°$ (FIG. 7C). Thus w' is represented as $w' = w - (h) \tan \theta$. Further, as previously mentioned, excess conductor metal deposited from the evaporated stream 30, is deposited on top portions of the gate electrode 32 increasing the thickness thereof. Such excess gate metal accumulates upon sidewall portions 22' of aperture 22, as shown. The resulting increased thickness of the gate electrode 32 reduces the resistance of the gate electrode 32. Thus the reduced resistance of the gate electrode may result in reduced signal loss of a signal fed through such gate electrode 32.

The step of alignment of the gate electrode mask (not shown) between the drain electrode 18 and source electrode 19 will now be described in detail. The wafer 10 is shown to be aligned about a device centerline 50 of the FET device (i.e., a point midway between drain electrode 18 and source electrode 19). A gate electrode centerline 52 about which gate electrode 32 is aligned, and an aperture centerline 54 about which the aperture 22 and gate recess 24 are aligned, are also shown. Gate electrode centerline 52 and aperture centerline 54 are here displaced a predetermined amount $t_1$, and $t_2$ respectively from the device centerline 50. Once the design goal location for the gate electrode centerline 52 has been determined with respect to the centerline 50, the center of the aperture in the mask (not shown) used to form the aperture 20 (FIG. 2) in masking layer 16 is placed the amount $t_2$ from the centerline 50. It is noted that there is a distance $\Delta t$ between the center of the aperture in the mask and the center of the gate electrode. Aperture 20 (FIG. 2) and aperture 22 (FIG. 3) formed in masking layer 16 and masking layer 14 are thus displaced an amount $t_2 = t_1 + \Delta t$. Proper displacement of the aperture centerline 54 from the device centerline 50 will thus provide a gate electrode 32 aligned about the desired location for the gate electrode centerline 52. The amount t of displacement from the gate electrode centerline 52 may be represented as $\Delta t = h/2 \tan \theta \sin \phi$. Thus, the aperture centerline 54 is displaced an amount $t_2 = t_1 + h/2 \tan \theta \sin \phi$ from the device centerline 50 in a direction here toward the source electrode 18. It is noted that $t_1$ is a function of the particular device characteristics, and in some applications it may be desirable to have $t_1 = 0$.

Figure 5:
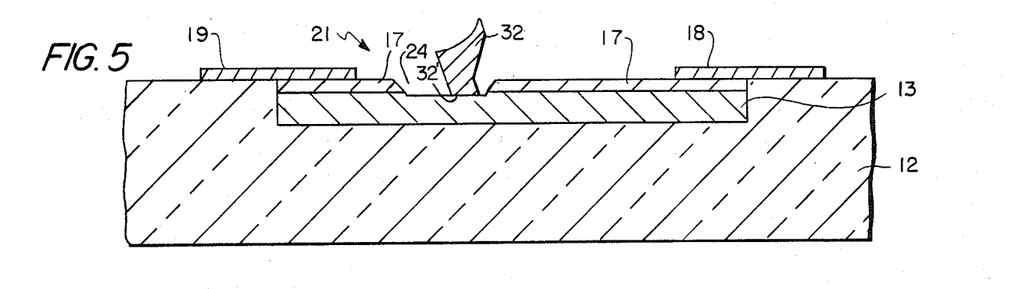
Figure 6:
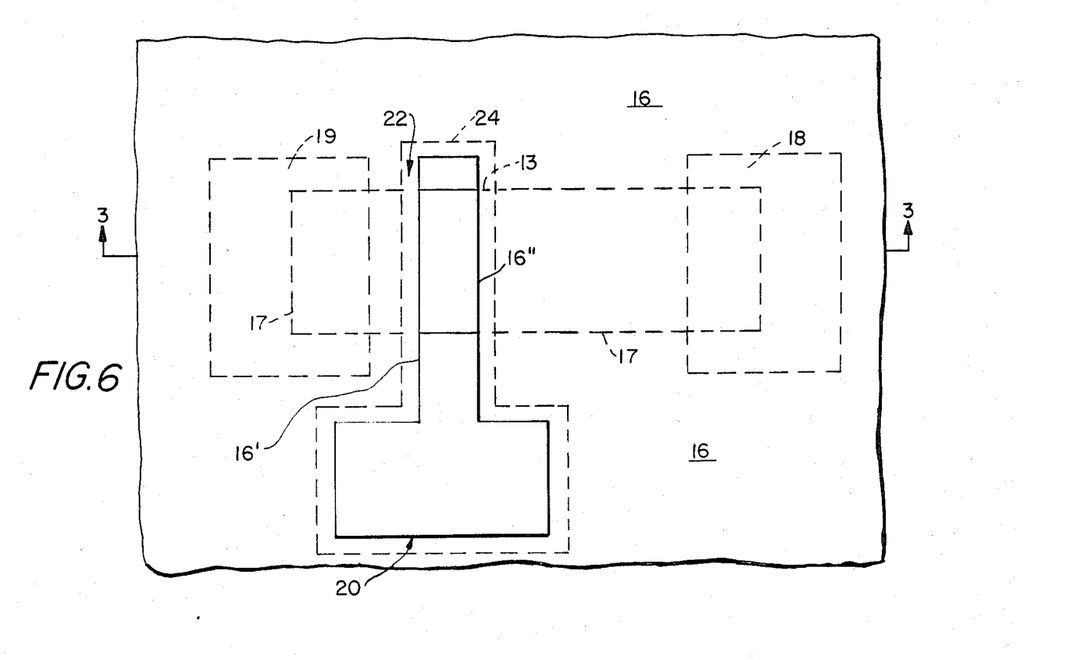
FIG. 6 is a top view of the wafer of FIG. 3 showing an aperture formed in a masking layer used to form the gate electrode and gate pad of the FET.

Referring now to FIGS. 5, 8 the masking layers 14, 16, and metal layer 33 deposited thereon, are removed by conventional lift off techniques, such as disolving the masking layers 14, 16 in a solution of trichloroethylene, providing the field effect transistor 21 having gate electrode 32 with a submicron width 32' thereof, as shown. A gate pad 37 (FIG. 8) is formed in the recess 24 integral with the gate electrode 32, as shown.

Figure 9:
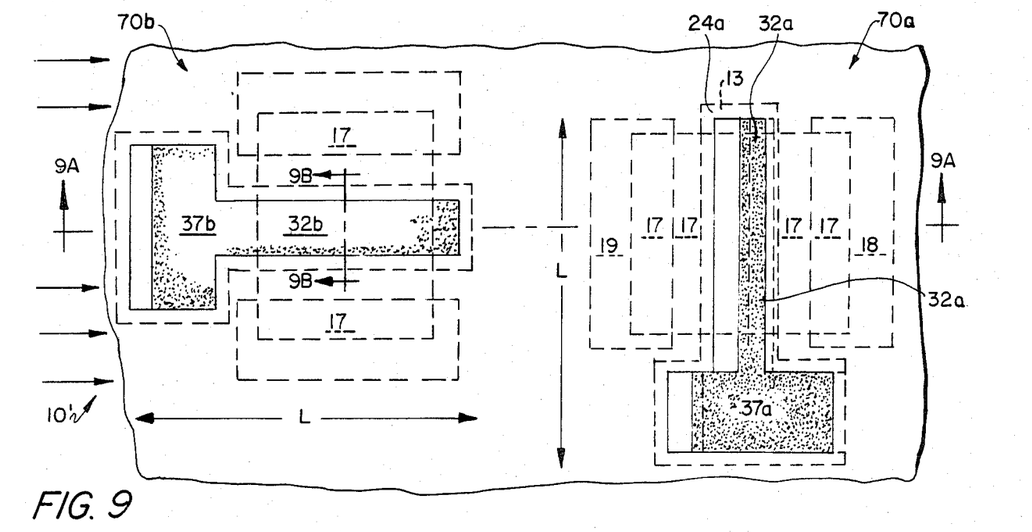
FIG. 9 is a top view of a wafer including a pair of FET's, each FET having an aperture in which is formed a gate electrode according to an alternate embodiment of the invention.
Figure 9A:
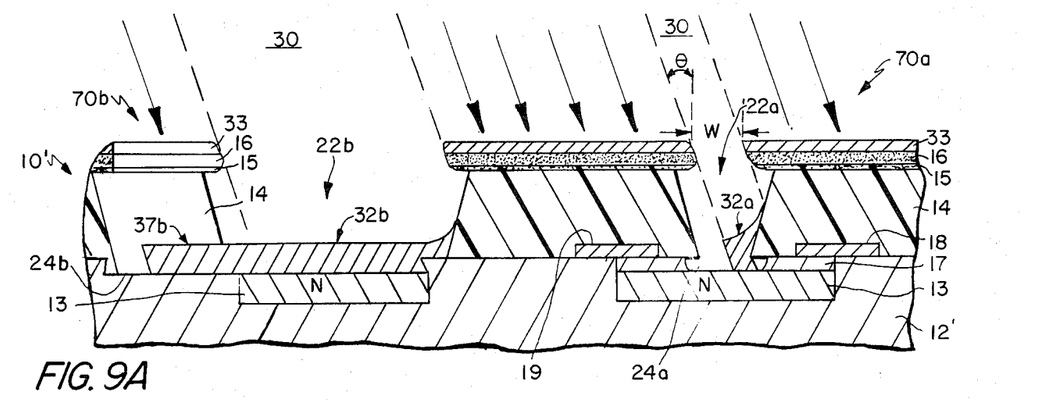
FIGS. 9A and 9B are cross-sectional views of gate electrodes of the FET shown in FIG. 9.
Figure 9B:
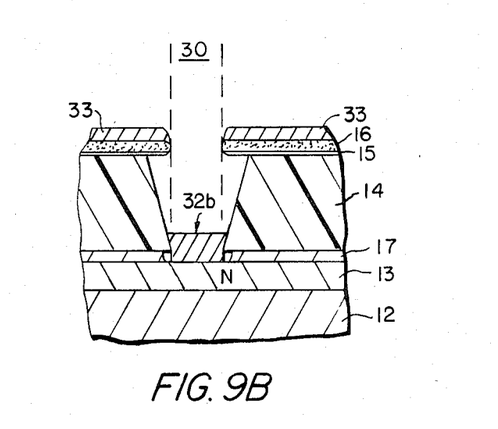
Figure 10:
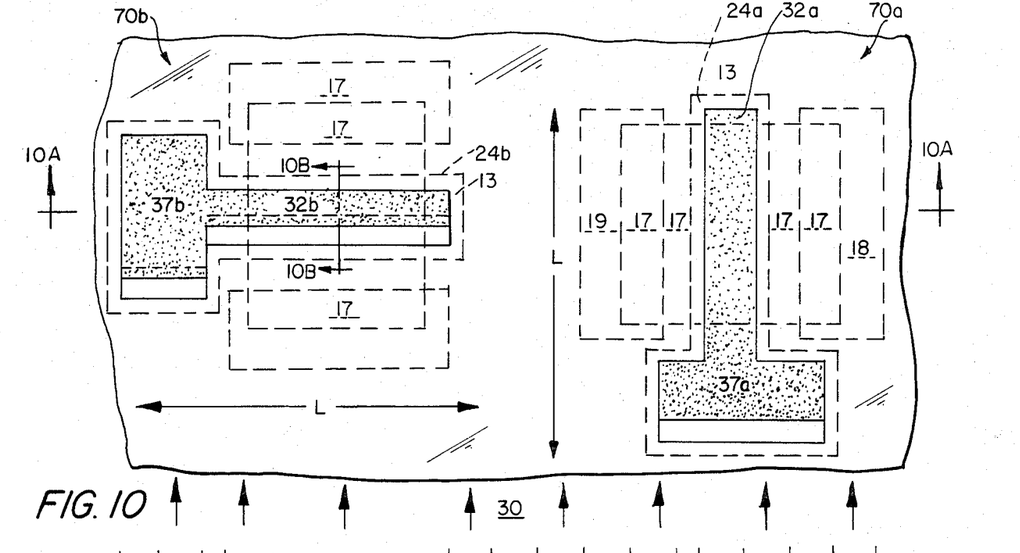
FIG. 10 is a top view of a wafer including a pair of FET's, each FET having an aperture in which is formed a gate electrode in accordance with an alternate embodiment of the invention.
Figure 10A:
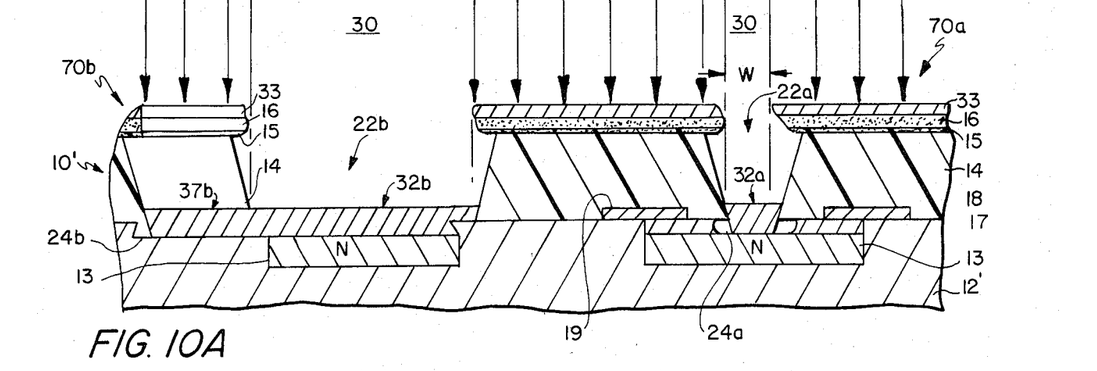
FIGS. 10A and 10B are cross-sectional views of the gate electrodes of the FET's shown in FIG. 10.
Figure 10B:
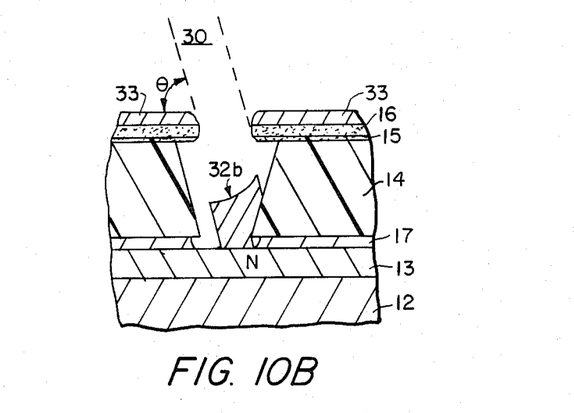

Referring now to FIGS. 9, 9A and 9B an alternate embodiment of the invention is shown to include a wafer 10' having a first FET 70a and a second FET 70b formed on a substrate 12', as shown. FET's 70a, 70b each include a drain electrode 18a, 18b and source electrode 19a, 19b formed on the substrate 12'. A pair of masking layers 14, 16, as previously explained, are provided on the substrate 10'. Apertures 22a–22b are here formed in the masking layers 14, 16 as shown. That is FET's 70a, 70b are here formed perpendicular to each other with apertures 20a, 20b in masking layers 14, 16 exposing portions of the substrate 12' beneath. Apertures 22a, 22b are provided to facilitate formation of gate electrodes 32a, 32b therein. Each of the apertures 22a, 22b, here have a width (w) and a depth (h), as previously described. A pair of recesses 24a, 24b in N+ type layer 13 and substrate 12' are provided as previously explained. FET 70a here includes a gate electrode 32a' having a submicron width $w_a'$ providing a submicron length thereof formed on the substrate 12' and a gate pad 37a, as shown. By depositing metal at an oblique angle $\theta$ through such aperture 22a, the gate electrode 32a is formed having a width $w_a'$ on the substrate 12' related to the width of the aperture w and the angle of evaporation $\theta$. Field effect transistor 70b' is here formed orthogonal to field effect transistor 70a', and includes the gate electrode 32b formed on the substrate 12 and a gate pad 37b, as shown. In accordance with the invention gate electrodes 32a, 32b are formed as follows: a stream 30' of evaporated metal is directed to the surface of the wafer 10'. Here the width ($w_i$) of the conductor formed in apertures 22a, 22b is given by $w_i = w(h) \tan \theta \sin \phi$, where $\phi$ is the angle between the orthogonal projection 48 of the beam 30 on the wafer 10 and the corresponding shadowing edge of the aperture, i is the number of the aperture, and $\theta$ is the incident angle of the stream 30' with respect to a normal to the surface of the substrate 12'. Thus, the gate electrode 32a formed in the aperture 22a where the gate electrode width is perpendicular to the length L of the aperture 22a thereof is represented as $w_a' = w - (h) \tan \theta \sin \phi$, where $\sin \phi = 1$. Thus, $w_a = w - (h) \tan \theta$ (FIG. 9A). The width $w_b'$ of conductor 32b formed in aperture 22b is represented by $w' = w - h \tan \theta \sin \phi$. Here $\sin \phi = 0$ therefore $w_b'$ may be represented as $w_b' = w - 0$, $w' = w$. Thus, for the case when the gate electrode 22a is perpendicular to the length L of the aperture 32a, the width of the gate electrode 32a is related to the tan $\theta$ (FIG. 9A) and for the case where the gate electrode width $w_b$ is parallel to the length (L) of the aperture 22b the gate electrode width $w_b'$ equals the aperture width W (FIG. 9B). In a similar manner as shown in FIGS. 10, 10A and 10B, by rotating the wafer 10' by 90° about the axis 43 the angle perpendicular to the length (L) of aperture 22b, and the gate electrode width $w_b'$ is represented as $w'_b = w - (h) \tan \theta$ for $\sin \phi = 1$ and the gate electrode width $w'_a'$ is represented as $w'_a = w$, as previously described in conjunction with FIGS. 9, 9A and 9B. Further, by selecting $\phi$ to be between 0° and 90°, an additional degree of control for formation of a gate electrode is provided.

Having described preferred embodiments of the invention, it will now become readily apparent to those of skill in the art that other embodiments incorporating the concepts of the invention may be realized. It is felt, therefore, that this invention should not be limited to the disclosed embodiments but rather should be limited only to the spirit and scope of the appended claims.

What is claimed is:

1. A method of forming a conductor having a submicron dimension (w′) on an exposed surface of a substrate including the steps of:
   providing a composite masking layer having a composite thickness (h) over such substrate, further comprising the steps of:
   depositing a first relatively thick layer of a first resist over the substrate to increase the surface flatness of the substrate, said first resist having a first resolution characteristic;
   depositing a second relatively thin layer of a second, different resist over the first layer of resist, said second resist having a second resolution characteristic higher than the first characteristic of said first resist;
   exposing selected portions of said first layer by patterning the second layer of resist to provide a relatively high resolution pattern in such second masking layer having a predetermined dimension (w);
   etching the underlying portion of said first layer of resist, using the second layer as a mask to provide the exposed portion of the substrate; and
   depositing selective portions of a stream of metal onto the exposed portion of the substrate at an oblique angle $\theta$ with respect to a normal to the surface of the substrate, using the composite mask to shield a portion of the exposed substrate from the obliquely angled stream of metal to form the conductor having the dimension w′, where w′ is substantially related to the dimension w in the high resolution pattern and the thickness h of the masking layer.

2. A method of forming a field effect transistor on a substrate having source and drain electrodes disposed on source and drain contact regions and a gate electrode therebetween comprising the steps of:
   providing a composite mask on the substrate comprising first and second different masking layers;
   forming an aperture in the composite mask exposing a portion of the substrate between the source and drain contact regions and undercutting sidewall portions of said first masking layer to provide overhanging portions of said second masking layer;
   directing an obliquely angled stream of conductive material at the substrate; and
   depositing such directed stream of conductive material through the aperture onto the substrate to provide the gate electrode, with said overhanging portions isolating the material of the gate from material deposited on the mask.

3. A method of forming a gate electrode for a field effect transistor comprising the steps of:
   forming a masking layer of resist having a thickness (h) over a substrate;
   forming an aperture in said masking layer having overhanging portions, with an opening width (w) between said overhanging portions, to expose an underlying portion of the substrate;
   directing a stream of conductive material toward the substrate at an oblique angle $\theta$ with respect to the substrate;
   depositing the conductive material through the aperture forming the gate electrode having a portion thereof disposed on the substrate, said portion having a dimension (w′) substantially equal to $w-(h)\tan\theta$, with the overhanging portion shadowing the stream to isolate the conductive material of the gate electrode from conductive material deposited on the masking layer.

4. A method of forming a gate electrode for a field effect transistor having source and drain electrodes comprising the steps of:
   providing a masking layer over a substrate;
   forming an aperture in the masking layer exposing a portion of the substrate between the source and drain regions;
   directing an obliquely angled stream of conductive material toward the substrate;
   depositing such directed stream of conductive material onto the masking layer and through the aperture, onto portions of the substrate using the mask to isolate the conductive material deposited on the masking layer from the conductive material deposited within the aperture on the substrate; and then
   lifting off the masking layer and the conductive material deposited thereon, while leaving the conductive material on the substrate to provide the gate electrode.

5. The method recited in claim 4 wherein the mask forming step further comprises the steps of:
   depositing a first relatively thick layer of a first resist over the substrate to increase the surface flatness of the substrate;
   depositing a second relatively thin layer of a second, different resist over the first layer of resist; and
   wherin the aperture forming step comprises the step of:
   (i) forming such aperture with portions of the second masking layer overhanging portions of the first masking layer, such overhanging portions of the second masking layer shielding portions of a sidewall of the aperture from the conductive material to provide the isolation.

6. The method of claim 1 wherein the dimension w′ is related to $w-(h)\tan\theta$.

7. The method as recited in claim 1 wherein during the etching step the first layer of resist is etched away to provide overhanging portions of the second masking layer; and
   wherein during the depositing step the overhanging portions are provided to isolate the metal providing the gate electrode from metal deposited on the composite mask.

* * * * *